United States Patent [19]

Wiles

[11] 3,708,722

[45] Jan. 2, 1973

[54] SEMICONDUCTOR DEVICE WITH SOLDERED TERMINALS AND PLASTIC HOUSING AND METHOD OF MAKING THE SAME

[75] Inventor: Philip Wiles, Erie, Pa.

[73] Assignee: Erie Technological Products, Inc., Erie, Pa.

[22] Filed: Dec. 18, 1970

[21] Appl. No.: 99,541

[52] U.S. Cl..........317/234 R, 317/234 A, 317/234 E, 317/234 G, 317/234 L, 29/589

[51] Int. Cl...............................H01l 3/00, H01l 5/00

[58] Field of Search........317/234, 235, 1, 3, 3.1, 5.2, 317/11, 5.4, 4, 5.3, 4.1; 29/589

[56] References Cited

UNITED STATES PATENTS

| | | | |
|---|---|---|---|
| 3,210,618 | 10/1965 | Rosenberg et al. | 317/234 |
| 3,381,184 | 4/1968 | Jamison | 317/234 |
| 3,408,451 | 10/1968 | Redwanz | 317/234 |
| 3,475,662 | 10/1969 | Zido | 317/235 |
| 3,374,405 | 3/1968 | Davis | 317/234 |
| 3,389,457 | 6/1968 | Goldman et al. | 317/234 |
| 3,418,544 | 12/1968 | France et al. | 317/234 |
| 3,428,871 | 2/1969 | Scott et al. | 317/234 |
| 3,474,302 | 10/1969 | Blundell | 317/234 |
| 3,532,944 | 10/1970 | Ollendorf et al. | 317/234 |
| 3,559,004 | 1/1971 | Rambeau et al. | 317/234 |

FOREIGN PATENTS OR APPLICATIONS

| | | | |
|---|---|---|---|
| 975,573 | 11/1964 | Great Britain | 317/234 E |
| 1,200,951 | 9/1965 | Germany | 317/234 N |

*Primary Examiner*—John W. Huckert
*Assistant Examiner*—Andrew J. James
*Attorney*—Ralph Hammar

[57] ABSTRACT

A semiconductor device encapsulated in insulating material which is interlocked to a flange of dovetail shape in axial cross section and of non circular shape in diametral cross section, and having ohmic contacts to leads made by solder fillets between convex surfaces on the leads and planar surfaces on the semiconductor device.

5 Claims, 10 Drawing Figures

INVENTOR

Philip Wiles

BY

Ralph Hamman

ATTORNEY

Figure 1:
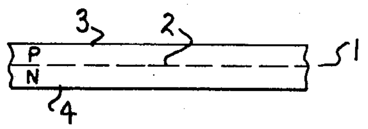
Figure 2:
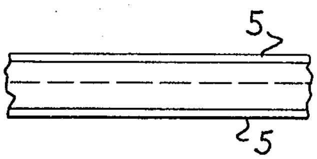
Figure 3:
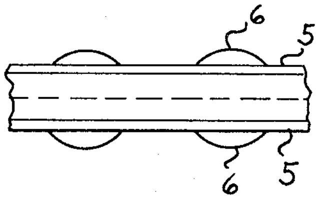
Figure 4:
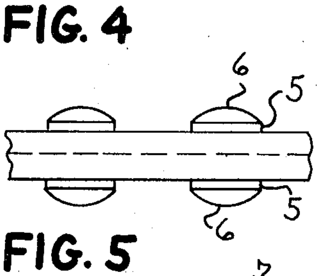
Figure 5:
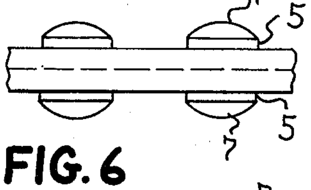
Figure 6:
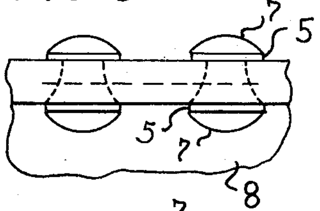

SEMICONDUCTOR DEVICE WITH SOLDERED TERMINALS AND PLASTIC HOUSING AND METHOD OF MAKING THE SAME

This invention is a diode or like semiconductor protected from mechanical and thermal shocks.

Figure 7:
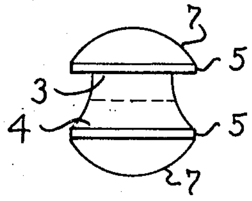
Figure 9:
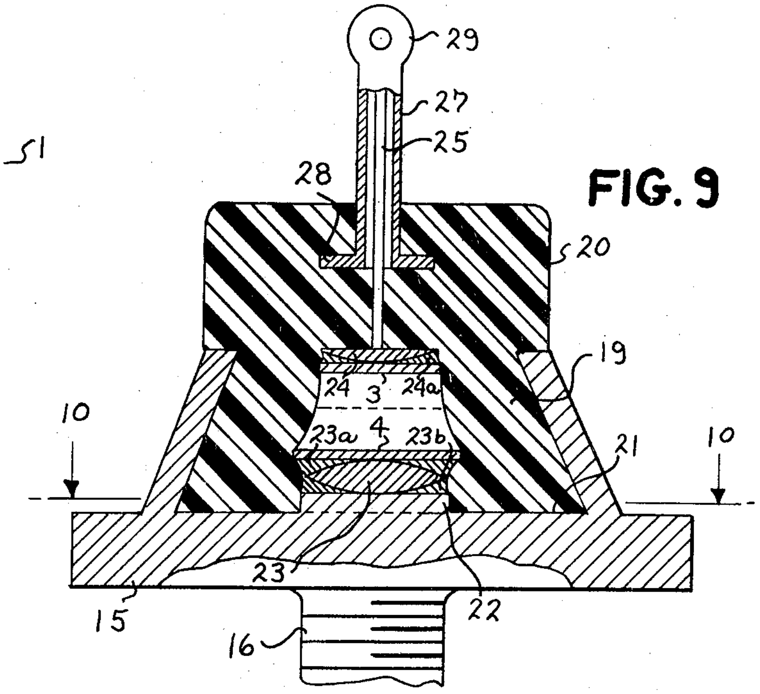
Figure 10:
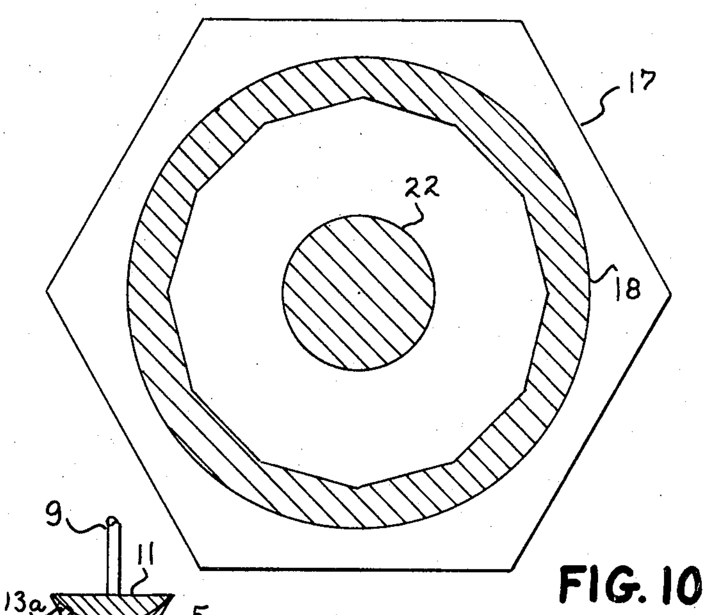
Figure 8:
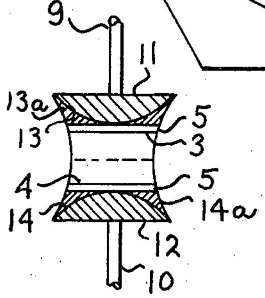

In the drawing,

FIGS. 1 through 7 are drawings of a silicon diode chip in its successive stages of manufacture, FIG. 8 is a sectional elevation of a completed diode with the leads attached, FIG. 9 is a sectional elevation of another diode with a stud mounting, and FIG. 10 is a section on line 10—10 of FIG. 9.

The manufacture of the semiconductor device starts with a slice 1 of semiconductor material such as silicon having a PN junction 2 between its upper and lower planar faces 3, 4. In the first step, the upper and lower faces are plated with nickel 5 to provide surfaces to which solder will adhere. The next step is to apply dots 6 of a resist such as wax and then to etch away the nickel plating 5 between the dots. The slice is then dipped in solder which melts away the wax dots and substitutes solder dots 7 adhering to the nickel plating. Solder does not adhere to the silicon. The slice is then mounted on a suitable holder by wax 8 which covers the entire lower surface of the slice. By immersing the slice in an etching solution which attacks the silicon but which does not attack the solder or wax, the slice is separated into a plurality of individual diodes as shown in FIG. 7, each provided with solder dots for connection to leads. It will be noted that the upper surface 3 of the individual diode is of lesser diameter than the lower surface 4.

FIG. 8 shows an individual diode connected to leads 9, 10 having heads 11, 12 with convex surfaces 13, 14 respectively soldered to the nickel coatings 5 on upper and lower planar diode surfaces 3 and 4. As the solder dots 7 melt, the convex surfaces 13, 14 settle into self centering contact with the nickel coatings 5 and the solder flows outward over the convex surfaces as shown at 13*a* and 14*a*. The solder joint is free of voids and is distributed so as to minimize mechanical and thermal stresses on the diode chip.

FIGS. 9 and 10 show a stud mounting package for the diode of FIG. 7. In this package, the base 15 has on its lower side a threaded stud 16 for mounting on a chassis. The base has a hex wrench surface 17 to facilitate mounting. On the upper side of the base is an upstanding circular flange 18 with walls inclined inward as shown in the axial cross section of FIG. 9 so as to provide a dovetail connection 19 for a molded case 20. The dovetail connection 19 anchors the case 20 against axial forces. As shown in the section of FIG. 10, the inner surface of the flange 18 is of polygonal or non circular shape in a plane perpendicular to the axis of the stud so that rotation of the case 20 relative to the flange is prevented.

At the center of the upper surface 21 of the base is an upstanding projection or pedestal 22 having a flat upper surface for connection to one of the terminals of the diode. The connection is made through a convex disc 23 of solder adherent material such as silver, which is connected by solder fillet 23*a* to the lower planar surface of the diode chip in the same manner as the connection of the head 12 in FIG. 8. The connection to the upper surface 3 of the diode chip is through a solder fillet 24*a* to a convex head 24 at the lower end of copper lead 25. The solder fillets 23*a*, 24*a* are both void free and stress free. Conveniently, the lead 25, the diode chip, the disc 23 and the solder fillets 23*a*, 24*a* is a sub assembly which is connected to the pedestal 22 by solder fillet 23*b*. The lead solder fillets 23*a*, 24*a* are soft enough to prevent cracking of the diode chip under thermal stress. The fillets provide matched contacts to the chip. The surface tension of the solder pulls the parts 23, 24 against the chip and eliminates the necessity for weights. Since solder does not wet silicon, any excess solder flow over the opposite surface of the head 24 and disc 23. The upper lead 25 is surrounded by a copper tube 27 having an outwardly projecting flange 28 at its lower end which is embedded in and interlocked with the case 20.

After the diode chip has been mounted on the base 15 and electrically connected to the base and to the lead 25, 27, the case 20 of suitable insulating material such as epoxy resin is molded around the diode assembly. Thereafter, the upper end of the lead 25, 27 may be fattened or swaged to form a terminal or lug 29. The tube 27 provides supplemental current carrying capacity for the lead 25. In conjunction with the lead 25, the tube 27 provides a flexible connection which accommodates misalignment when loading the diode assembly into the mold for the case 20. A lead of the current carrying capacity of the lead 25 and tube 27 would be too rigid and could overstress the connection 24a to the diode chip.

What is claimed is:

1. A metal base having a depending threaded stud and a wrench surface, an upwardly presented contact on the base, a semiconductor device having an electrode connected to said contact, walls on the base extending axially from the base and surrounding the element, said walls having inner surfaces which are non circular in a plane perpendicular to the axis of the stud, and a molded plastic case embedding the device and conforming to the inner surfaces of the walls and to the surfaces of the base within said walls.

2. The structure of claim 1 in which said non circular walls are the inner surface of an upstanding cylindrical flange surrounding said contact.

3. The structure of claim 2 in which said flange is of dovetail shape in axial cross section.

4. The structure of claim 1 in which said non circular walls have portions inclined inwardly toward said contact to interlock with said case.

5. The structure of claim 1 in which the semiconductor device has another electrode connected to a copper wire lead surrounded by a copper tube having a flange embedded in and interlocked with said plastic case.

* * * * *